United States Patent [19]

Whetsel, Jr.

[11] Patent Number: 4,872,169

[45] Date of Patent: Oct. 3, 1989

[54] HIERARCHICAL SCAN SELECTION

[75] Inventor: Lee D. Whetsel, Jr., Plano, Tex.

[73] Assignee: Texas Instruments Incorporated, Dallas, Tex.

[21] Appl. No.: 282,827

[22] Filed: Dec. 8, 1988

Related U.S. Application Data

[63] Continuation of Ser. No. 23,088, Mar. 6, 1987, abandoned.

[51] Int. Cl.[4] .............................................. G01R 31/28
[52] U.S. Cl. .................................................... 371/22.3
[58] Field of Search .................. 371/15, 25; 324/73 R, 324/73 AT

[56] References Cited

U.S. PATENT DOCUMENTS

| | | | |
|---|---|---|---|
| 4,597,042 | 6/1986 | d'Angeac | 364/200 |
| 4,621,363 | 11/1986 | Blum | 371/25 |
| 4,680,733 | 7/1987 | Duforestel | 371/25 X |
| 4,698,588 | 10/1987 | Hwang | 371/25 X |
| 4,701,921 | 10/1987 | Powell | 371/25 |
| 4,710,931 | 12/1987 | Bellay | 371/25 |
| 4,710,933 | 12/1987 | Powell | 371/25 |

Primary Examiner—Charles E. Atkinson
Assistant Examiner—Robert W. Beausoliel
Attorney, Agent, or Firm—Thomas R. FitzGerald; Leo N. Heiting; Melvin Sharp

[57] ABSTRACT

A method of testing circuitry is by the application of scan design which consists of a series of shift registers or latches which form a serial scan path through a logic circuit. The scan path can be used to observe and control logic elements in the design via serial scan operations. The present invention allows a continuous scan path to be compressed or expanded so that the scan path only passes through the desired logic element(s) to be tested. Devices connected on the serial scan path (or ring) can be selected or deselected thus allowing the serial path to either flow through or bypass a given logic circuit's internal scan path. The invention can be used to create a hierarchical scan network consisting of a primary scan ring from which a multiplicity of scan sub-rings may be accessed.

13 Claims, 2 Drawing Sheets

HIERARCHICAL SCAN SELECTION

BACKGROUND AND SUMMARY:

With the advent of Surface Mount Devices, Application Specific ICs (ASICs), and double sided boards, board level testing is rapidly becoming a major problem. The test cost also increases dramatically with higher density.

One technique employed in IC designs to improve testability and reduce test cost, is to partition off sections of the main logic design into separately testable modules. The partitioning is accomplished by surrounding the modules with a boundary scan ring, using either Shift Register Latches (SRL) or Scan Registers (SR). This same technique can be used at the boundary of any well-defined logic block. Utilizing a boundary scan technique around an IC's I/O structure provides similar benefits at the board level as at the IC level.

Traditionally in systems employing the boundary scan technique, a trade-off had to be made between the length of the scan and the number of connectors required to interface with the SRLs. If the minimum number of connectors was used (i.e. only that needed to scan in/out the test data/result), then the length of the scan could be tremendous. Regardless of how few points were to be tested, the scan length would not change. Alternatively, the scan length could be broken into smaller segments, but the access lines (connectors) would increase proportionally.

Due to the fixed scan length limitations, it has been impractical to consider adding boundary scan tests internal to an IC where logic blocks may be tested, in conjunction with a system level test (i.e. multi-ICs). This has resulted in having to have a separate testing method for an IC and a board or system.

The present invention allows a continuous scan path to be compressed or expanded so that the path only passes thru the logic sections being tested. This Fast Scan (FSCAN) technique is implemented with a simple logic design that is referred to as the Device Select Module (DSM).

By using FSCAN, devices that are connected on a serial data ring can be selected or deselected allowing the serial path to either flow throw or bypass the device's internal scan path. In addition, FSCAN can be used in IC designs to partition off sections of the core logic for internal scan testing. One advantage of FSCAN over the traditional scan path is that it reduces the test time required to load and unload the scan path and eliminates the need of additional IC pins and board I/O connectors for individual device scan-enable control signals.

Another advantage of the FSCAN technique is that it tends to make the scan path more fault tolerant. For example if a scan sub-ring connected to the main scan path were to experience a short or open condition, causing it to disable the rest of the scan path, it could simply be deselected using the FSCAN's Device Select Module (DSM). Once a DSM is deselected, the main scan path simply bypasses that sub-ring.

It is an object of the present invention to minimize the number of connectors needed for testing.

It is also an object of the present invention to allow boundary scan testing to be performed on a portion of an individual device, an individual device as a whole, a group of devices, and a system.

It is a further object of the present invention to allow a variable scan length so as to minimize scan times.

It is an additional object of the present invention to create a higher degree of fault tolerance.

These and other objects are achieved by a boundary scan test system comprising:

a plurality of logic devices, each having input and output lines for selectively transmitting and receiving data;

a first and second of said logic devices, each further including a logic core and a scan cell having multiple bit positions;

said scan cells being logically located between said logic core and said input and output lines of said first and second logic devices wherein selected bits of said multiple bit positions, under control, are selectively substituted for said data;

each of said first and second said logic devices further including a device select module connected to respective said scan cells of said first and second said logic devices;

said device select module of said first logic device being also coupled to a first bus for receiving test data bits and being further coupled to said device select module of said second logic device via a second bus;

said device select module of said first logic device, in response to selected ones of said test data bits, selectively loading other selected ones of said test data bits into said scan cell connected to said device select module of said first logic device and transmitting other selected ones of said test data bits to said device select module of said second logic device via said second bus; and said device select modules further controlling the said substitution of data by said connected scan cells.

DETAILED DESCRIPTION OF THE INVENTION

While Device Select Modules (DSMs) may be used in other types of scan designs, the presently preferred embodiment uses the DSMs in a boundary scan. Boundary scan is a testing technique wherein a logic element(s) is surrounded by a scan path, allowing the element(s) to be controlled and observed via the scan path. The boundary scan cells typically consist of serial shift registers. During test each shift register bit has the ability to output data to, or load data from, the element surrounded by the boundary scan. In normal operation each shift register bit has a bypass facility to allow system input and output to propagate thru the shift register unobstructed. These boundary scan cells are known by those skilled in the art.

Figure 1:
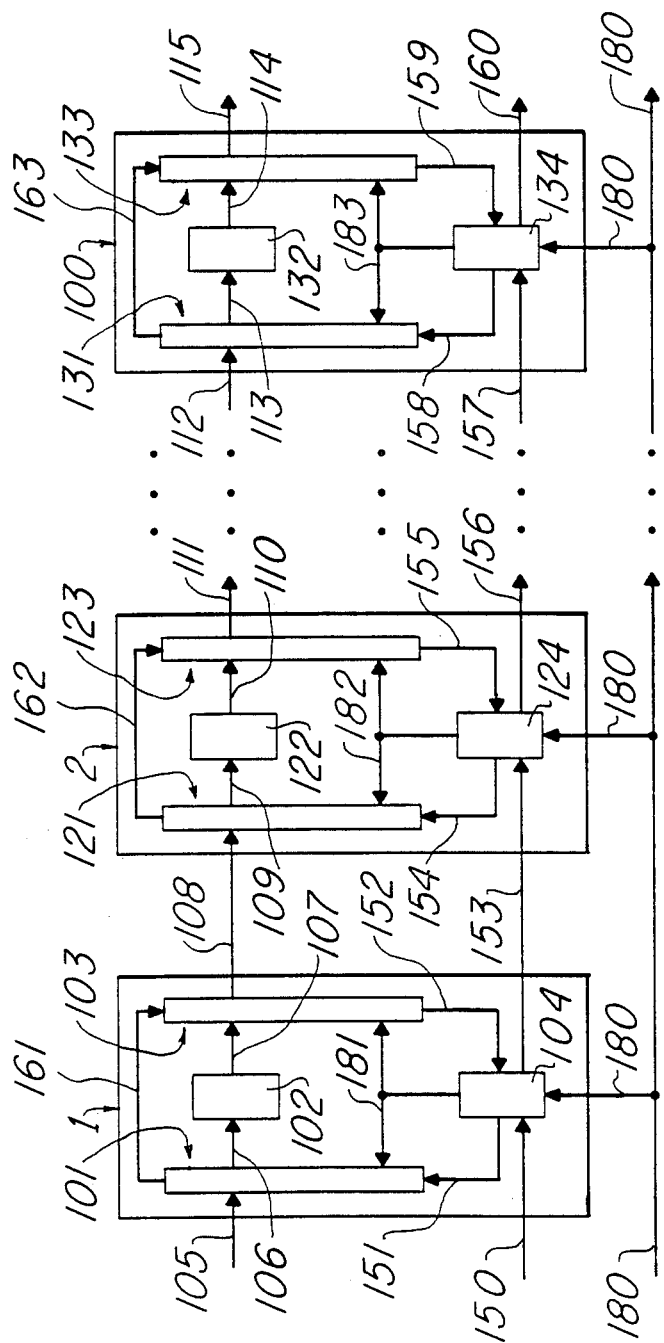
FIG. 1 shows a number of logic blocks, each surrounded by boundary scan cells controlled by DSMs.

Referring to FIG. 1, it can be seen that logic device 1 has a logic core 102 that is surrounded by boundary scan cells 101 and 103. Normal incoming data on bus 105 can either be captured by scan cell 101, or passed through to bus 106 feeding logic core 102. Alternatively, data stored in scan cell 101 may be fed onto bus 106 and into logic core 102. Similarly, data output from logic core 102 on bus 107 can either be captured by scan cell 103, or passed through to bus 108. Data can also be output from scan cell 103 onto bus 108.

Logic devices 2 and 100 are similar to logic device 1 in that they have; scan input cells 121 and 131, input bus ®s 108 and 112, internal input buses 109 and 113, logic cores 122 and 132, internal output buses 110 and 114, and output buses 111 and 115. Logic devices 1,2, and 100 also have: DSMs 104, 124, and 134; DSM external scan data input buses 150, 153, and 157; DSM external scan data output buses 153, 156, and 160; DSM external control input bus 180; DSM internal scan data output buses 151, 154, and 158; DSM internal scan data input buses 152, 155, and 159; DSM internal control output buses 181, 182, and 183; and internal scan cell connecting buses 161, 162, and 163.

The present invention employs Device Select Modules (DSMs) (104, 124, 134) to provide a mechanism allowing a primary scan ring consisting of external scan data input (150, 153, 157) and output (153, 156, 160) buses along with external control bus (180), to select and access embedded lower level scan rings. In this manner the primary scan ring can be expanded to include one or more sub-rings attached to the primary scan ring. Each sub-ring attached to the primary scan ring may in turn select and access other levels of sub-rings, thus creating a hierarchy of scan sub-rings. After the access to the sub-ring(s) is complete, the primary scan ring may be compressed to its normal length by deselecting the selected sub-ring(s).

A deselected sub-ring is selected by setting its DSM to a logic one during a scan operation. A selected sub-ring is deselected by setting its DSM to a logic zero during a scan. The scan used to select or deselect a DSM(s) is referred to as a Mapping Scan. At power up, or upon reset, all sub-ring DSMs will be initialized to a deselected state.

In addition to providing a hierarchical scan ring structure, the DSM can be used to gate control signals to each sub-ring in the scan network. The scan cells (101, 103, 121, 123, 131, 133) have certain control inputs that allow them to perform scan and test operations. If a DSM is selected, it will allow these control signals to pass through to the scan cells. If deselected, the control signals are gated off.

There are two main advantages in using DSMs. The first is that access time to a selected sub-ring is reduced by not having to clock serial data through the entire length of the expanded scan path. Secondly, an open circuit in one or more of the subrings will not disable the entire scan ring.

In a conventional boundary scan system: bus 150 would be coupled to scan cell 101; scan cell 103 would be coupled to bus 153, which in turn would be coupled to scan cell 121; scan cell 123 would be coupled to bus 156; bus 157 would be coupled to scan cell 131; scan cell 133 would be coupled to bus 160; and control bus 180 (scan clock, scan enable, and other required control inputs) would be coupled to all scan cells 101, 103, 121, 123, 131, and 133. Any data to be loaded into scan cell 131 would thus have to first travel through scan cells 101, 103, 121, and 123. Further, as there is no way to deselect a logic device, all devices are simultaneously caused to shift data from their respective scan cells even if one is interested only in one device. This is turn means that data has to be scanned into all the scan cells for any scan.

As an example of how long a conventional scan loading operation would take, consider the following:
1. Assume that there are 100 logic devices (in FIG. 1, this would be logic devices 1, 2, . . . ,100).
2. Assume that each scan cell is a 100 bit shift register (in FIG. 1 these would be scan cells 101, 103, 121, 123, . . . ,131 and 133).
3. Further assume that the scan clock rate (i.e. how fast data can traverse the scan cells) is 1 MHz.

The amount of time for the operation is therefore:

devices  scan cells/device  bit positions/cell  clock rate
 (100    *        2         *      100)        / 1,000,000 =

.02 seconds

While this amount of time does not seem to be particularly long, it must be remembered that each logic device may require thousands of test patterns to be run through in order to test it. In contrast, the present invention allows this time to be dramatically shortened. The DSMs (104, 124, 134) allow each logical device's (1, 2, . . . , 100) scan cells (101, 103, 121, 123, 131, 133) to be selected or deselected, thus varying the length of the scan path. The full functionality of the DSMs will be explained below.

Two scans are required to insert data into the scan cells. The first scan is used to select which DSM(s) is to be placed in the scan path (and thus which scan cells). If a DSM is selected, then it will route the data through its associated scan cells and otherwise will pass data through it. A second scan is used to insert data into, and extract data from, the selected scan cells. An example of this is shown as follows.
1. Assume that there are 100 logic devices (in FIG. 1, this would be logic devices 1, 2, . . . ,100).
2. Assume that each scan cell is a 100 bit shift register (in FIG. 1 these would be scan cells 101, 103, 121, 123, . . . ,131 and 133).
3. Assume that the scan clock rate (i.e. how fast data can traverse the scan cells) is 1 MHz.
4. Assume that logic device 50 is to be loaded with data from its scan cell inputs.

The amount of time for the operation is therefore:

FIRST SCAN

DSMs in system  clock rate
    100           /1,000,000= .0001 seconds

SECOND SCAN

DSM   sel. devices  bit positions/sel. device  clock rate
 100  +    (1      *         200)               / 1,000,000=

.0003 seconds

Figure 2:
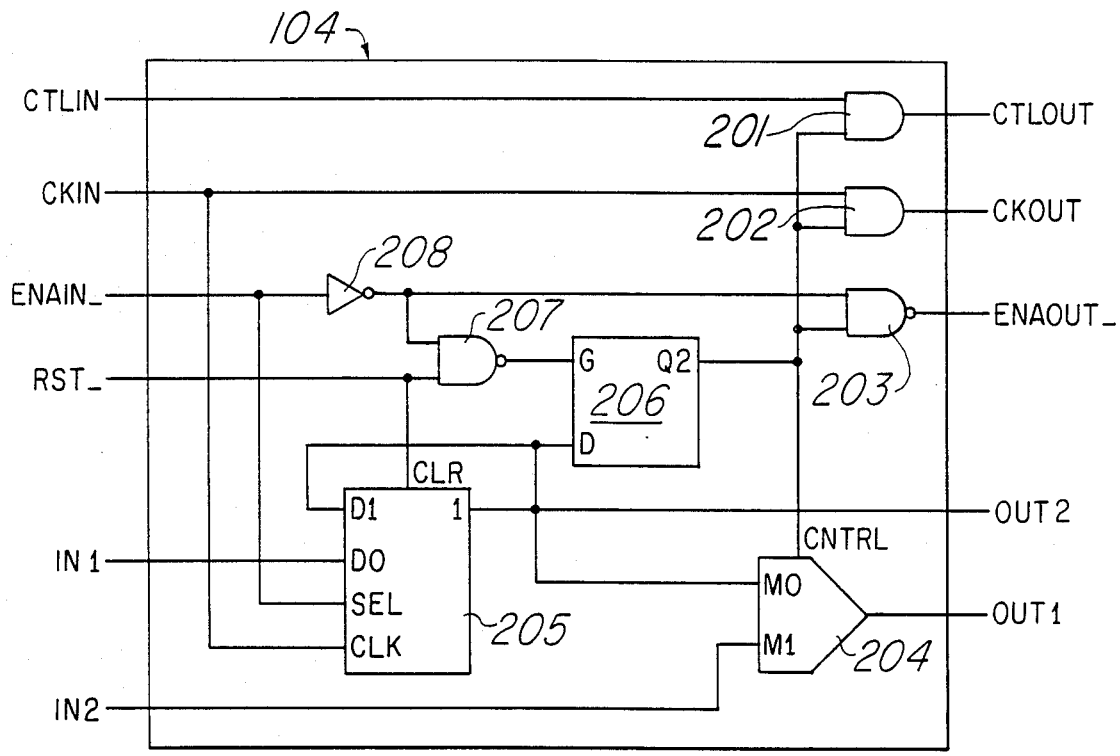
FIG. 2 shows a detailed logic diagram of the presently preferred/embodiment of the DSM used in the invention.

Total time required using the present invention is 0.0004 seconds as opposed to 0.02 seconds using conventional techniques. Note that in a typical run of 1000 scans cycles, the time for the conventional technique would be 20 seconds. For the present invention, the time would be 0.3001 seconds, as the first scan (i.e. Mapping Scan) only has to be performed once since the last data scan can be used to deselect device 50's DSM. Referring now to FIG. 2, one preferred embodiment of the DSM 104 (from FIG. 1) is shown. The preferred embodiment includes; AND gates 201 and 202, NAND gates 203 and 207, inverter 208, latch 206, Dual port flip-flop 205, and 2-to-1 multiplexor 204. These individual structures may be of the type known in the art.

Figure 3:
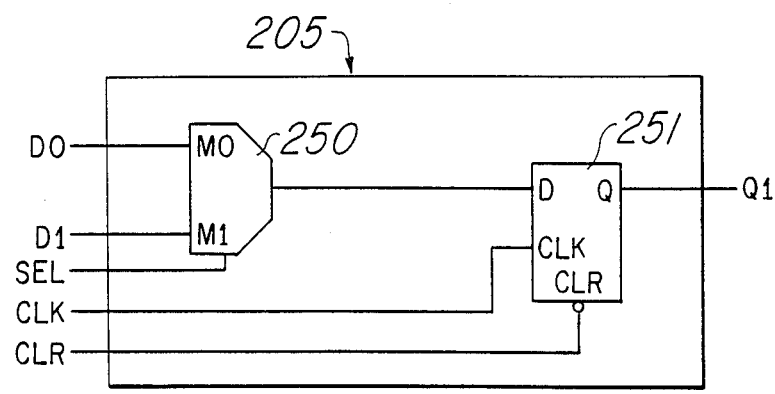
FIG. 3 shows a logic diagram of the presently preferred embodiment of the dual port flip-flop used in the invention.

FIG. 3 illustrates a presently preferred embodiment of the dual port flip-flop 205 as used in FIG. 2. This embodiment includes; D flip-flop 251; and 2-to-1 multiplexor 250. The action of multiplexor 250 is to select the D input of flip-flop 251. If multiplexor select input SEL is low, D0 is connected to the D input of flip-flop 251. If multiplexor input SEL is high, D1 is connected to the D input of flip-flop 251.

By referencing FIGS. 1 and 2, it will now be shown how the inputs to DSM 104 (CTLIN, CKIN, ENAIN_, RST—, IN1, and IN2) and the outputs from DSM 104 (CTLOUT, CKOUT, ENAOUT_, OUT2, and OUT1) relate to the buses 150, 151, 152, 153, 180, and 181. Inputs CTLIN, CKIN, ENAIN_and RST are control inputs and all arrive at DSM 104 via bus 180. Input IN1, scan data input, arrives at DSM 104 via bus 150. Input IN2 is from scan cell 103 over bus 152. Outputs CTLOUT, CKOUT, and ENAOUT_ go into both scan cells 101 and 103 via bus 181. Output OUT2 goes into scan cell 101 via bus 151. OUT2 forms the beginning of the internal data scan path which passes thru scan cell 101, over bus 161, thru scan cell 103, and back to DSM 104 input IN2 over bus 152. Output OUT1 is output from DSM 104 via bus 153

The CKIN is the clock used for the scan. As can be seen, this clock is not transmitted to the scan cells (output signal CKOUT) unless the DSM is selected (by action of latch 206) due to the AND gate 202. Similarly, signals CTLOUT and ENAOUT_ are not sent to the scan cells unless the DSM is selected due to AND gate 201 and NAND gate 203 respectively.

The CTLIN signal is used to inform the scan cells (by passing through as output signal CTLOUT) that a certain action is to be performed. In the presently preferred embodiment, this signal is used to latch data in the scan cells by conventional means. In some instances, as more control may be needed, additional lines may be used.

ENAIN_ is an inverted (i.e. low is active) signal that is used to allow data to be scanned into, and out of, scan cells and DSMs. As stated above, the corresponding output signal (ENAOUT_) is not output to the scan cells unless the DSM is selected Latch 206 is constructed such that when input G (from NAND gate 207) is high, then the data present at input D appears as output on Q2. When input G is low, the output Q2 does not change.

Dual port flip-flop 205 is constructed with a clock input CLK, a selector SEL for selecting whether input D1 or input D0 is coupled to output Q1 and a clear input CLR. Note that the CLR input is connected to the RST_ input of the DSM 104.

RST_ is an inverted signal used to reset (i.e. deselect) the DSMs on a global basis. Taking DSM 104 of FIG. 2 as an example, it will now be shown how this is achieved. When the RST_ signal is triggered (i.e. pulled low), then the CLR signal is given to dual port flip-flop 205. This causes Q1 to output low. In turn, a 0 appears as the inputs D1 of dual port flip-flop 205, D of latch 206, and M0 of multiplexor 204. The output of NAND gate 207 will be high regardless of what ENAIN_ is. Since G is high (i.e. high from NAND gate 207), then output Q2 will be low as D is low. This deselects the DSM. DSM 104 will remain deselected after the RST_ input goes back to its normal high state if the CKIN and ENAIN_ inputs remain inactive, CKIN is inactive low and ENAIN_ is inactive high.

A DSM may be in one of two states, Selected or Deselected. In each of these two states the DSM can either be Idle, (i.e. scan is disabled) or Active, (i.e. scan is enabled). DSM input ENAIN_ determines the Idle or Active condition for both states. Refer to the preferred embodiment of DSM 104 as shown in FIG. 2 during the following DSM state descriptions.

A DSM is in the Deselect state and Idle if: Q1 and Q2 are low, ENAIN_ is high, and RST_ is high. In this state latch 206 is enabled (G is high by action of Nand gate 207) and Q2 is low as D is low as Q1 from dual port flip-flop 205 is low. Output Q1 is low and remains low regardless of any clock inputs at CLK input from CKIN because of the feedback path from Q1 to D1 back to Q1 (D1 is selected back to Q1 by SEL which is high as ENAIN_ is high). Multiplexor 204 connects Q1 to OUT1 since CTRL is low as Q2 is low. In addition, all control outputs (CTLOUT, CKOUT, and ENAOUT_) are disabled by Q2 being low. Also scan data outputs (OUT1 and OUT2) are low because Q1 is low.

A DSM is in the Deselect state and Active if: Q2 is low, ENAIN_ is low, and RST_ is high. In this state latch 206 is not enabled (G is low by action of nand gate 207) and Q2 remains low regardless of the logic level on D. Input D0 of dual port flip-flop 205 is directed Q1 by action of SEL being low as ENAIN_ is low. Multiplexor 204 connects Q1 to OUT1 since CNTRL is low as Q2 is low. In this configuration a scan path exist from IN1 to D0, thru dual port flip-flop 205 to Q1, from Q1 to M0, thru multiplexor 204 to OUT1. Control outputs (CTLOUT, CKOUT, and ENAOUT_)are disable by Q2 being low. While CKOUT is disabled, external scan operations are inhibited between OUT2 and IN2 and thus any external scan path is deselected from the DSM.

A DSM is in the Select state and Idle if: Q1 and Q2 are high, ENAIN_ is high, and RST_ is high. In this state latch 206 is enable (G is high by action of Nand gate 207) and Q2 is high as D is high as Q1 from dual port flip-flop 205 is high. Output Q1 is high and remains high regardless of any clock inputs at CLK input from CKIN because of the feedback path from Q1 to D1 back to Q1 (D1 is selected back to Q1 by SEL which is high as ENAIN_ is high). Multiplexor 204 connects IN2 to OUT1 since CTRL is high as Q2 is high, Control outputs CTLOUT and CKOUT are enabled and ENAOUT_ is disabled (forced high) by ENAIN_ being high. In this configuration scan operations are inhibited thru the dual port flip-flop 205 by the feedback connection (Q1 to D1 to Q1) and externally by ENAOUT_ (external scan enable control) being disable (i.e. forced high) by ENAIN_ being high. However, in this state the DSM can pass control and clock signals from inputs CTLIN and CKIN to outputs CTLOUT and CKOUT to allow attached scan cells to perform certain test operations.

A DSM is in the Select state and Active if: Q2 is high, ENAIN_ is low, and RST_ is high. In this state latch 206 is not enabled (G is low by action of Nand gate 207) and Q2 remains high regardless of the logic level on D. Input D0 of dual port flip-flop 205 is directed to Q1 by action of SEL being low as ENAIN_ is low. Multiplexor 204 connects IN2 to OUT1 since CNTRL is high as Q2 is high. In this configuration a scan path exists from IN1 to D0, thru dual port flip-flop 205 to Q1, from Q1 to OUT2, from OUT2 thru an externally connected scan path and back to IN2, from IN2 to M1 of multiplexor 204, and from M1 to OUT1. Control outputs (CTLOUT, CKOUT, and ENAOUT_) are enabled by Q2 being high allowing control inputs (CTLIN, CKIN, and ENAIN_) to pass thru the DSM and out to externally connected scan cells.

There is a one scan bit overhead for each DSM. This bit is the dual port flip-flop 205 and is used to control the DSM's state (i.e. selected or deselected). The last bit that is clocked into an Active DSM (selected or deselected) before ENAIN_ goes back high (signalling the end of a scan cycle and forcing an "Idle") determines the DSM's next state (selected or deselected). For example, referring to FIG. 2, if DSM 104 is presently in the Select state and Active (Q2 is high and ENAIN_ is low), the last scan bit clocked into Q1 of dual port flip-flop 205 by CKIN is transferred into Q2 of latch 206 after G is driven high by ENAIN_ going high (signalling the end of the select scan cycle and causing the DSM to go Idle). If the last bit (Q1) was a one then Q2 stays at a one and the DSM remains in the Selected state and Idle (Q1, Q2, and ENAIN_ are all high). If the last bit (Q1) was a zero then Q2 changes to a zero and the DSM goes to the Deselect state and Idle (Q1 and Q2 are low and ENAIN_ is high). While Idle, in either the Select or Deselect state, Q1 and thus Q2 cannot change states (unless RST_ is taken low), thus the next Active scan cycle (ENAIN_ going low) starts off in the state the DSM was placed in after the last Active scan cycle.

When a DSM is Selected and Active, subsequent data is clocked thru the scan loop associated with the DSM before being output to any other DSM (and its loops). Referring to FIG. 1, this would mean (assuming that DSM 104 was selected) that data coming in on bus 150 would pass through DSM 104, onto bus 151, thru scan cell 101, across bus 161, trough scan cell 103, onto bus 152, back through DSM 104 and out onto bus 153. When a DSM is Deselected and Active, subsequent data is clocked only thru the DSM before being output to any other DSM (and its loops). Referring to FIG. 1 again, this would mean (assuming DSM 104 was deselected) that data coming in on bus 150 would enter DSM 104, pass thru the DSM's dual port flip-flop, and exit DSM 104 via bus 153.

While the preferred embodiment of the DSM as shown in FIG. 2 employs a dual port flip-flop, a latch, and other logic gates, it should be apparent that this is only one implementation. One skilled in the art can make many different implementations without departing from the scope of the invention.

The present invention is not limited to having a single DSM per IC. The hierarchical scan can be used to test individual logic blocks within a single IC, or can be used on a more macro approach of allowing scans of logic blocks composed of many ICs. A given DSM may have, in it selectable scan path, a series of other DSMs. In turn, these DSMs may also have in each of their selectable scan paths still another series of DSMs. Thus a true hierarchical scan path structure can be created. Because any one or more of the DSMs (and its associated scan path) in the hierarchy can be selected or deselected, the length of time to perform a test can be as short or long as necessary.

In addition, the present invention is not limited to uses within IC scan designs. A DSM can be implemented as an IC to be used in board designs providing the same hierarchical scan structure at the board level as it provides at the IC level. In the application of a DSM IC, a board scan path could be selected or deselected in the same way as that of an IC's internal scan path.

Also due to the ability to isolate any ring, the present invention allows a test of certain areas even if there is a complete open circuit in some of the rings. Further, a single type of test can be used to isolate faults within an IC, a circuit, a board, and a system. This leads to greatly reduced testing redundancy, higher degree of certainty of a fault, and dramatically reduced testing time and cost.

While references have been made to a specific preferred embodiment of the present invention, no limitations are to be implied from them. The only limitations implied or expressed are those in the claims.

What is claimed is:

1. A boundary scan test system comprising:
   a plurality of logic devices, each having input and output lines for selectively transmitting and receiving data;
   a first and second of said logic devices, each further including a logic core and a scan cell having multiple bit positions;
   said scan cells being logically located between said logic core and said input and output lines of said first and second logic devices wherein selected bits of said multiple bit positions, under control, are selectively substituted for said data;
   each of said first and second said logic devices further including a device select module connected to respective said scan cells of said first and second said logic devices;
   said device select module of said first logic device being also coupled to a first bus for receiving test data bits and being further coupled to said device select module of said second logic device via a second bus;
   said device select module of said first logic device, in response to selected ones of said test data bits, selectively loading other selected ones of said test data bits into said scan cell connected to said device select module of said first logic device and transmitting other selected ones of said test data bits to said device select module of said second logic device via said second bus; and
   said device select modules further controlling the said substitution of data by said connected scan cells.

2. The boundary can test system as claimed claim 1 wherein selected ones of said logic devices are individual integrated circuits.

3. The boundary scan test system as claimed in claim 1 wherein selected ones of said logic devices consist of a plurality of integrated circuits.

4. The boundary scan test system as claimed in claim 1 wherein said first and second of said logic devices are located on a common substrate.

5. The boundary scan test system as claimed in claim 1 wherein said scan cells comprise serial shift registers.

6. The boundary scan test system as claimed in claim 1 wherein said first and second buses comprise serial data buses.

7. The boundary scan test system as claimed in claim 1 wherein said device select module includes a dual port flip-flop.

8. A hierarchical test system comprising:
   a first device select module having a first input coupled to a bus for receiving test data bits from an external source;

a plurality of test cells each having at least a first input and a first output;

selected ones of said test cells being serially connected wherein the first input of one said test cells is connected to the first output of another of said test cells whereby said test data bits may be passed from one said test cell to another;

said first device select module having a first output coupled to a selected one of said test cells first input;

a second device select module having a first input coupled to a first output of a selected one of said test cells;

said second device select module having a first output coupled to the first input of a selected one of said test cells;

said first device select module having a second input coupled to the output of a selected one of said test cells wherein a first test ring is formed consisting of said first device select module, selected ones of said serially connected test cells, said second device select module, and other selected ones of said serially connected test cells;

said second device select module having a second output coupled to the first input of a selected one of said test cells and a second input coupled to the first output of one of said test cells wherein a second test ring is formed;

said first device select module selectively passing selected one of said test data bits received via said bus into said first ring; and said second device select module selectively in response to certain ones of said test data bits, passing selected ones of said test data bits received via said first test ring into said second test ring, and into said first test ring.

9. The hierarchical test system as claimed in claim 8 wherein said device select module includes a dual port flip-flop.

10. A variable length test scan system comprising:
a plurality of test rings;
each said test ring comprising,
a device select module having first and second inputs and first and second outputs, and
said first output of said device select module being coupled to the input of a plurality of test cells and said first output of said device select module being coupled to the output of said plurality of test cells;
said plurality of test rings being coupled together by serially coupling said second inputs and outputs of said device select modules; and
said device select modules selectively gating selected inputs from said second input of said device select module to said second output of said device select module and through said plurality of test cells.

11. The variable length test scan system as claimed in claim 10 wherein said device select module includes a dual port flip-flop.

12. A method of performing a test wherein there is a plurality of test circuits, with at least one of said test circuits comprising a test cell associated with a logic circuit to be tested and gating means for allowing test data bits to enter said test cell, comprising:
transmitting said test data bits in a serial manner to said test circuits;
selectively activating and deactivating said gating means in response to selected ones of said test data bits; and
loading other selected ones of said test data bits into those said test cells whose associated said gating means have been activated.

13. the method of performing a test as claimed in claim 12 wherein said gating means included a dual port flip-flop.

* * * * *

UNITED STATES PATENT AND TRADEMARK OFFICE
CERTIFICATE OF CORRECTION

PATENT NO. : 4,872,169

DATED : October 3, 1989

INVENTOR(S) : Lee D. Whetsel, Jr.

It is certified that error appears in the above-identified patent and that said Letters Patent is hereby corrected as shown below:

Column 10, line 11, delete "output" and insert --input--.

Signed and Sealed this

Twenty-eighth Day of December, 1993

Attest:

Attesting Officer

BRUCE LEHMAN

Commissioner of Patents and Trademarks